United States Patent [19]

Tamaki et al.

[11] Patent Number: 5,481,214
[45] Date of Patent: Jan. 2, 1996

[54] VOLTAGE TO PULSE-WIDTH CONVERSION CIRCUIT

[75] Inventors: Takashi Tamaki; Mitsuya Ohie, both of Tokyo, Japan

[73] Assignee: Oki Electric Industry Co., Ltd., Tokyo, Japan

[21] Appl. No.: 277,063

[22] Filed: Jul. 19, 1994

[30] Foreign Application Priority Data

Jul. 22, 1993 [JP] Japan .................................... 5-181669

[51] Int. Cl.$^6$ ................................................. H03K 3/017
[52] U.S. Cl. ............................ 327/172; 327/175; 377/42
[58] Field of Search ...................... 327/172–176, 327/291, 63; 277/42, 114

[56] References Cited

U.S. PATENT DOCUMENTS 4,891,828  1/1990  Kawazoe ..................... 377/42
5,277,497  1/1994  Enomoto ..................... 327/172

*Primary Examiner*—Timothy P. Callahan
*Assistant Examiner*—Jeffrey Zweizig
*Attorney, Agent, or Firm*—Spencer, Frank & Schneider

[57] ABSTRACT

A voltage to pulse-width conversion circuit having counter which counts a reference frequency and produces a digital output signal having a multi-bit digital value; a decoder which decode the multi-bit digital value of the digital output signal and outputs first and second decoded signals; a digital/analog converter which receives the first and second decoded signals and produces an analog signal having an analog voltage; a comparator which compares the reference voltage and the analog voltage and produces a comparison result signal and a setting circuit which sets the level of the output node to a predetermined voltage level in response to the first and second decoded signals.

14 Claims, 6 Drawing Sheets

VOLTAGE TO PULSE-WIDTH CONVERSION CIRCUIT

CROSS REFERENCE TO RELATED APPLICATION

This application claims priority of Japanese patent application Serial No. 5-181,669, filed Jul. 22, 1993, the subject matter of which is incorporated herein by reference.

BACKGROUND OF THE INVENTION

1. Field of the Invention

This invention relates to a voltage to pulse-width conversion circuit for brightness control of an electronic indicating instrument such as, for example, a phosphor indicator tube.

2. Related Background Art

In Japanese Patent Application Laid-open No. 219222-1988, for example, there is disclosed a technology related to a voltage to pulse-width conversion circuit.

SUMMARY OF THE INVENTION

An object of this invention is to provide a voltage to pulse-width conversion circuit which is more precise and stable.

The above objects are generally achieved according to the present invention by a voltage to pulse-width conversion circuit comprising: a clock input terminal for receiving a clock signal having a reference frequency, a reference voltage input terminal for supplying a reference voltage, an output node for applying a pulse-width signal, a counter receiving the clock signal and producing a digital output signal having a multi-bit digital value corresponding to a count of cycles of the reference frequency, a decoder for decoding the multi-bit digital value of the digital output signal and outputting first and second decoded signals, a digital/analog converter for receiving the first and second decoded signals and producing an analog signal having an analog voltage corresponding to the first and second decoded signals, a comparator for comparing the reference voltage and the analog voltage and producing a comparison result signal corresponding to the voltage difference between the reference voltage and the analog voltage and a setting circuit for setting the level of the output node to a first logic level in response to the first decoded signal and to a second logic level in response to the comparison result signal after the first decoded signal.

DETAILED DESCRIPTION OF THE PREFERRED EMBODIMENTS

Figure 1:
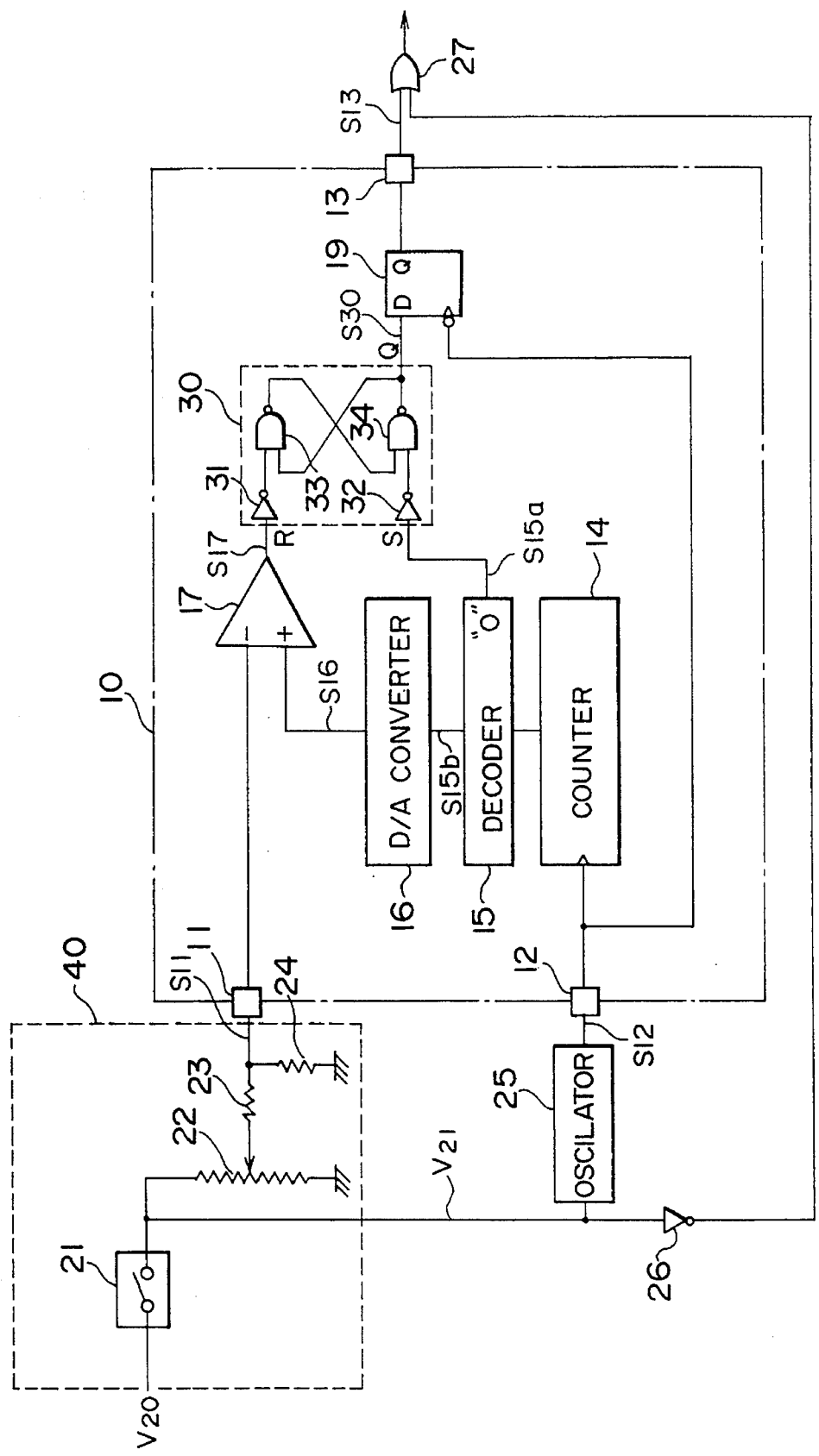
FIG. 1 is a circuit diagram illustrating an embodiment of a voltage to pulse-width conversion circuit of this invention.

Referring to FIG. 1, there is shown a preferred embodiment of a voltage to pulse-width conversion circuit of the present invention. This voltage to pulse-width conversion circuit 10 has an input terminal 11 which receives a pulse-width modulation control signal S11 (hereinafter "PWM control signal S11"), an input terminal 12 which receives a clock signal S12 having a reference frequency, for example, of 32,768 kHz, an output terminal 13 which receives a pulse-width modulation signal S13 (hereinafter "PWM signal S13") having a frequency, for example, of 128 Hz. In addition, the voltage to pulse-width conversion circuit 10 includes, for example, an 8-bit binary counter 14, for example, an 8-bit decoder 15, for example, a 6-bit resistance voltage divider type digital to analog converter 16 (hereinafter "D/A converter"), a comparator 17, a reset-set flip-flop 30 (hereinafter "RS-FF 38"), and a delay type flip-flop 19 (hereinafter "D-FF").

The input terminal 12 is connected to a clock input terminal of the binary counter 14 and a clock input terminal of the D-FF19. An output terminal of the binary counter 14 is connected to an input terminal of the decoder 15. The decoder 15 includes an output terminal Out 0 for outputting a "0" output signal S15a and output terminals Out 1 to Out 63 and Out 64 to Out 255 for outputting an output signal S15b (the output terminals Out 0 to Out 63 and Out 64 to Out 255 are described later); the output terminal Out 0 is connected to a set input terminal S of the RS-FF 30 and the output terminals Out 1 to Out 63 and Out 64 to Out 255 are connected to an input terminal of the D/A converter 16. A positive input terminal of the comparator 17 is connected to an output terminal of the D/A converter 16 to which an analog signal S16 is output, and a negative input terminal is connected to the input terminal 11. A reset terminal R of the RS-FF30 is connected to an output terminal of the comparator 17, the set terminal S is connected to the output terminal Out 0, an output terminal Q is connected to a data input terminal D of the D-FF19. The data output terminal Q of the D-FF19 is connected to the output terminal 13. The RS-FF30 includes inverters 31 and 32 and cross-coupled NAND gates 33 and 34.

An input circuit 40 for generating the PWM control signal S11 is connected to the input terminal 11 of the voltage to pulse-width conversion circuit 10. The input circuit 40 includes a switch 21, for example, for night lighting in a car, a variable resistor 22, and voltage divider type resistors 23 and 24. A car battery voltage V20 of approx. 13.8 V applied to one terminal of the switch 21 is supplied to an oscillator 25, an inverter 26, and the variable resistor 22 as a voltage V21 by turning on the switch 21.

The oscillator 25 applies the above-mentioned clock signal S12 to the input terminal 12.

The inverter 26 is a circuit for detecting an off state of the switch 21 and outputting an H-level signal. Its output terminal is connected to one input terminal of a 2-input OR gate 27, and the other input terminal of the OR gate 27 is connected to the output terminal 13 of the voltage to pulse-width conversion circuit 10.

Figure 2:
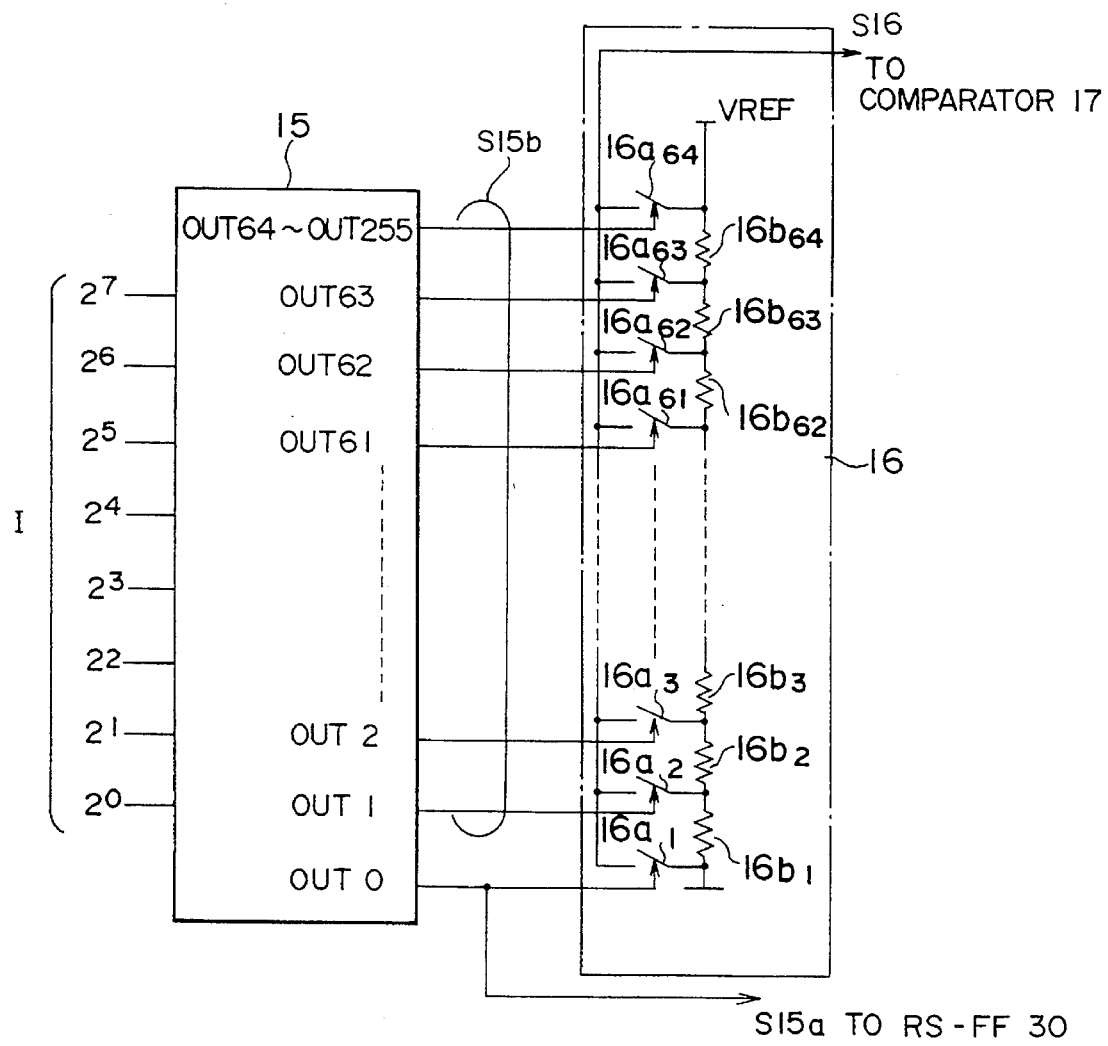
FIG. 2 is a diagram illustrating the configuration of a decoder and a digital to analog converter in FIG. 1.

Referring to FIG. 2, there is shown a circuit diagram illustrating a configuration of the decoder 15 and the D/A converter 16 of FIG. 1.

The decoder 15, which has an input terminal I of 8-bit inputs $2^0$ to $2^7$, the output terminal Out 0 for outputting the "0" output signal S15a, and the output terminals Out 1 to Out 63 and Out 64 to Out 255 for outputting the output signal S15b, is a circuit for decoding an output signal of the 8-bit binary counter 14 entered into the input terminal I and outputting the result of the decoding, output signals S15a and S15b, from output terminals Out 0 to Out 63 and Out 64 to Out 255.

Output terminals Out 0 to Out 63 and Out 64 to Out 255 of the decoder 15 are connected to control input terminals of analog switches $16a_1$ to $16a_{64}$ in the D/A converter 16, respectively. Terminals at one end of the analog switches $16a_1$ to $16a_{64}$ are connected in common to the output terminal of the D/A converter 16, and terminals at the other end of the switches are connected to nodes of voltage divider type resistors $16b_1$ to $16b_{64}$, respectively. The terminal at the other end of the analog switch $16a_1$ and the voltage divider type resistor $16b_1$ are grounded, and that of the analog switch $16a_{64}$ and voltage divider type resistor $16b_{64}$ are connected to a reference voltage $V_{ref}$.

Figure 3:
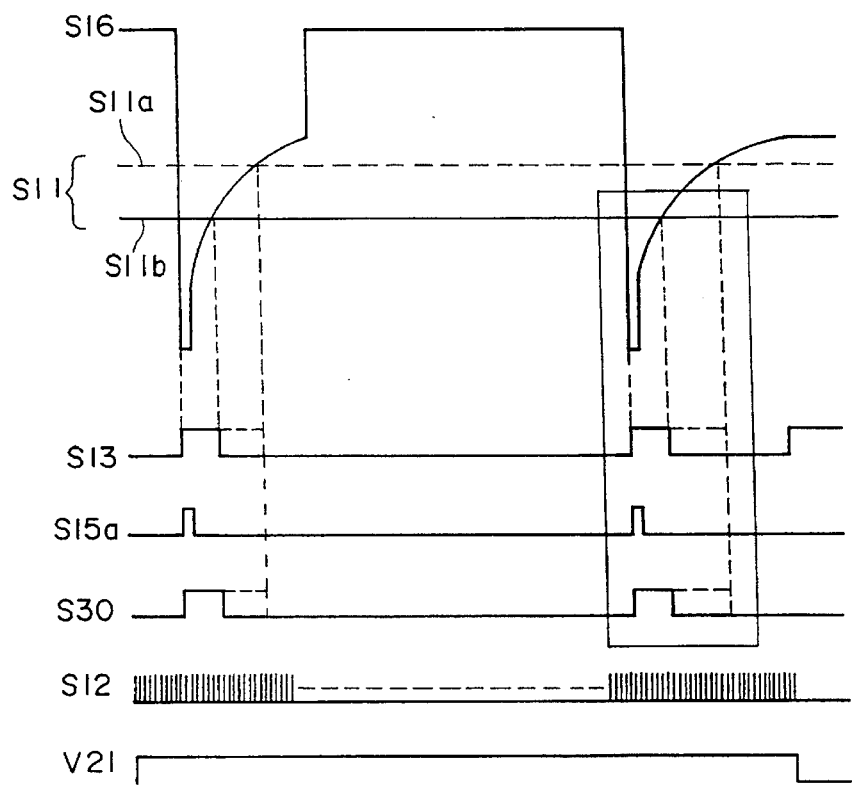
FIG. 3 is a timing diagram illustrating an operation of the voltage to pulse-width conversion circuit of the invention shown in FIG. 1.
Figure 4:
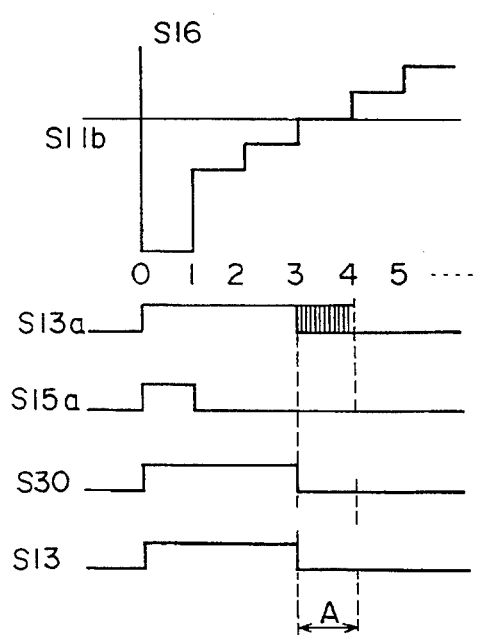
FIG. 4 is an enlarged view of the timing diagram shown in FIG. 3.

FIG. 3 is a timing diagram of the voltage to pulse-width conversion circuit 10 shown of FIG. 1, and FIG. 4 is a partially enlarged view of FIG. 3. Referring to these drawings, an operation of the voltage to pulse-width conversion circuit 10 in FIG. 1 will be described below. It should be noted, however, that a numeral preceded by S represents a signal.

In driving at night, for example, when the switch 21 for night lighting is turned on, the battery voltage V20 of approx. 13.8 V is supplied to the variable resistor 22 as V21 and to the oscillator 25 and the inverter 26. If the battery voltage V21 is applied to the variable resistor 22, a voltage of 0 to 13.8 V corresponding to variable resistor values is applied to voltage divider type resistors 23 and 24. The voltage at the node of the resistors 23 and 24 is applied to a negative input terminal of the comparator 17 via the input terminal 11 of the voltage to pulse-width conversion circuit 10 as the PWM control signal S11. The level of the PWM control signal S11 is changed by adjusting the variable resistor 22 to provide signals between S11a and S11b in FIG. 3. The resistor values of the voltage divider type resistors 23 and 24 depend on a restricted input voltage of the comparator 17.

If the battery voltage V21 is applied to the oscillator 25, said oscillator 25 outputs a clock signal S12 having a reference frequency 32,768 kHz with oscillation. The clock signal S12 is sent to the binary counter 14 via the input terminal 12 of the voltage to pulse-width conversion circuit 10. If the voltage V21 is applied to the inverter 26, said inverter 26 outputs an L-level signal to the OR gate 27. Accordingly the OR gate 27 opens.

When the clock signal S12 is sent to the binary counter 14, said binary counter 14 performs a counting operation from counter values 0 to 255 continuously and outputs the counting result to the decoder 15. The decoder 15 sequentially selects an output terminal out of the Out 0 to Out 63 and Out 64 to Out 255 corresponding to a counter value of the binary counter 14 entered into the input terminal I, outputs output signals S15a and S15b from output terminals selected out of the Out 0 to Out 63 and Out 64 to Out 255, and sequentially turns on the analog switches $16a_1$ to $16b_{64}$ in the D/A converter 16. Then, an analog signal S16 at a voltage set by voltage divider type resistors $16b_1$ to $16b_{64}$ is output from the output terminal of the D/A converter 16.

For example, in a period between counter values 0 and 1 on the binary counter 14 entered into the input terminal I of the decoder 15, an analog switch $16a_1$ in the D/A converter 16 is turned on by an output signal S15a output from the output terminal Out 0 of said decoder 15. Due to the off states of the other analog switches $16a_2$ to $16a_{64}$, an analog signal S16 of 0 V is output from the output terminal of the D/A converter 16. In the period between counter values 1 and 2 on the binary counter 14, an analog switch $16a_2$ in the D/A converter 16 is turned on by an output signal S15b output from the output terminal Out 1 of the decoder 15. Due to the off states of the other analog switches $16a_1$ and $16a_3$ to $16a_{64}$, the voltage value at a node of the voltage divider type resistors $16b_1$ and $16_1$ is output as an analog signal S16. The same operation is repeated up to the analog switch $16a_{64}$.

Since the binary counter 14 performs the counting operation continuously, the D/A converter 16 also selects the analog switches continuously out of the $16a_1$ to $16a_{64}$ in it, outputs an analog signal S16 having a waveform as shown in FIG. 3, and sends it to a positive input terminal of the comparator 17. It should be noted that, although the analog signal S16 in FIG. 3 is illustrated linearly during a period from the counter values 2 to 63, it has a stepped waveform as shown in FIG. 4 which is an enlarged view of FIG. 3.

The comparator 17 compares an analog signal S16 output from the D/A converter 16 with a PWM control signal S11 entered into the input terminal 11 to check which is greater, generates a comparison result signal S17 according to the magnitudes of signals S16 and S11, and outputs the signal to a reset input terminal R of the RS-FF30. If the output signal S15a output from the output terminal Out 0 of the decoder 15 is at an H level, the RS-FF30 outputs an H-level output signal S30 from an output terminal Q since it is set via a set input terminal S. Then, the D-FF19 fetches the H-level output signal S30 entered into a data input terminal D in response to the clock pulse S12 entered into the clock input terminal and outputs an H-level PWM signal S13 from said output terminal Q.

If the level of the analog signal S16 output from the D/A converter 16 exceeds the level of the PWM control signal S11 entered into the input terminal 11, the level of the comparison result signal S17 output from the comparator 17 is set to the H level. The RS-FF30 is reset in response to the H-level comparison result signal S17. When the RS-FF30 is reset, the output signal S30 is set to an L level. Since the L-level output signal S30 is fetched by the D-FF19, the PWM signal S13 output from said output terminal Q is set to an L level. According to the voltage to pulse-width conversion circuit of the present invention as described above, a PWM signal S13 having a duty factor depending on the PWM control signals S11a and S11b can be output from the output terminal 13 by controlling the variable resistor 22. The PWM signal S13 is output via an open OR gate 27.

When the switch 21 for night lighting is turned off, an output of the inverter 26 is set to an H level and sent to the OR gate 27. Accordingly, an output signal from the OR gate 27 is set to an H level independently of the level of the PWM signal S13.

This embodiment has the advantages described below.

If the level of the analog signal S16 output from the D/A converter 16 is close to the level of the PWM control signal S11b, it is difficult to obtain a stable level of the PWM signal S13 output from the D-FF19 due to an unstable output level of the comparator 17 as shown by the signal S13a in FIG. 4 (period A). To deal with this problem, this embodiment provides an RS-FF30 which forcibly sets the level of the Signal S30 at the first change of the output level of the comparator 17. This allows the D-FF19 to output a more stable PWM signal S13.

Figure 5:
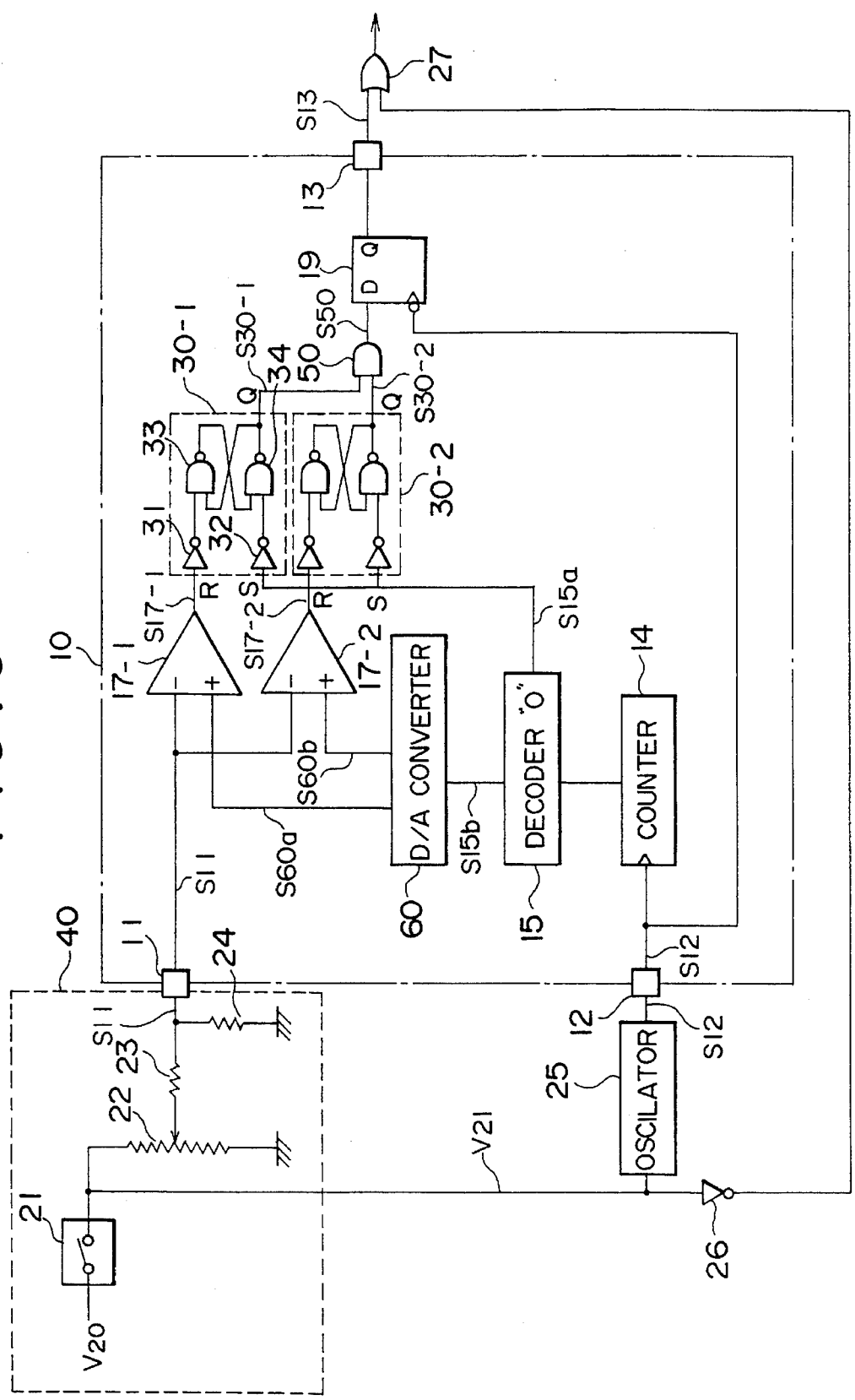
FIG. 5 is a circuit diagram illustrating another embodiment of the voltage to pulse-width conversion circuit of this invention.

Referring to FIG. 5, there is shown a circuit diagram of the voltage to pulse-width conversion circuit illustrating another embodiment of this invention, giving the same reference numerals for the same configuration as those in FIG. 1. The voltage to pulse-width conversion circuit 10 of FIG. 5 is different from that of FIG. 1 in that it has a 6-bit resistance voltage divider type D/A converter 60 having different components from those of the 6-bit resistance voltage divider type D/A converter 16, two comparators 17-1 and 17-2, two reset set flip-flops RS-FF30-1 and RS-FF30-2, and 2-input AND a gate 50.

The 6-bit resistance voltage divider type D/A converter 60 is a circuit for outputting two types of analog signals first and second analog signals S60a and S60b after performing digital to analog conversion of an output signal S15b of an 8-bit decoder 15. The first comparator 17-1 is a circuit for outputting the first comparison result signal S17-1, wherein a negative input terminal is connected to an input terminal 11 for entering a PWM control signal S11 and a positive input terminal is connected to an output terminal for outputting the first analog signal S60a of the D/A converter 60. The second comparator 17-2 is a circuit for outputting the second comparison result signal S17-2, wherein a negative input terminal is connected to the input terminal 11 and a positive input terminal is connected to an output terminal for outputting the second analog signal S60b of the D/A converter 60.

The first RS-FF30-1 and the second RS-FF30-2 each have the same components as the RS-FF30 in FIG. 1. The first RS-FF30-1 has a reset input terminal R connected to an output terminal of the first comparator 17-1 and a set input terminal S connected to an output terminal Out 0 for outputting a "0" output signal S15a of an 8-bit decoder 15. The RS-FF30-2 has a reset input terminal R connected to an output terminal of the second comparator 17-2 and a set input terminal S connected to the output terminal Out 0 of the decoder 15. Respective output terminals Q of the first RS-FF30-1 and the second RS-FF30-2 are connected to input terminals of 2-input AND gate 50. An output terminal of the AND gate 50 for outputting an output signal S50 is connected to a data input terminal D of the D-FF19.

Figure 6:
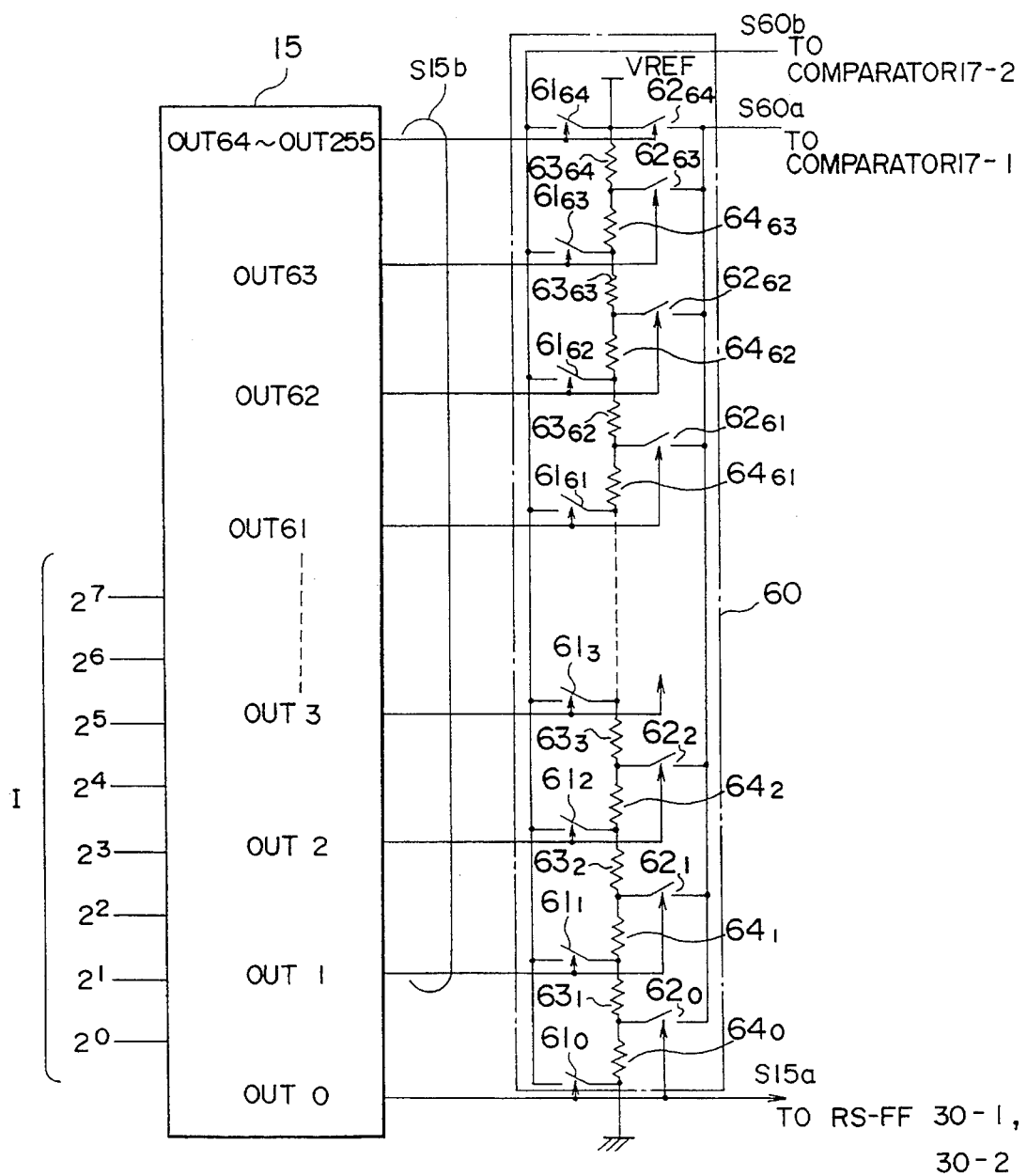
FIG. 6 is a diagram illustrating the configurations of a decoder and a digital to analog converter in FIG. 5.

FIG. 6 shows a circuit diagram illustrating an example of the configuration of the 8-bit decoder 15 and the 6-bit resistance voltage divider type D/A converter 60 in FIG. 5.

The resistance voltage divider type D/A converter 60 has analog switches $61_0$ to $61_{64}$ and $62_0$ to $62_{64}$ whose conduction is controlled by output signals S15a and S15b output from output terminals Out 0 to Out 63 and Out 64 to Out 255 of the decoder 15 and voltage divider type resistors $63_1$ to $63_{64}$ and $64_0$ to $64_{63}$. The voltage divider type resistors $63_1$ to $63_{64}$ and $64_0$ to $64_{63}$ are connected in series between a reference voltage $V_{ref}$ and a ground GND. One terminal of the voltage divider type resistor $64_0$ is connected to the GND and a terminal of the $63_{64}$ resistor is connected to the reference voltage $V_{ref}$.

The terminals at one end of the analog switches $61_0$ to $61_{64}$ are connected to nodes (at the lower potentials) of the voltage divider type resistors $64_0$ to $64_{63}$, respectively, and the terminals at the other end of the switches are connected in common to the output terminal of said D/A converter 60 which outputs the second analog signal S60b. The terminals at one end of the analog switches $62_0$ to $62_{64}$ are connected to nodes (at the lower potentials) of the voltage divider type resistors $63_1$ to $63_{64}$, and the terminal at the other end of the switches are connected in common to the output terminal of said D/A converter 60 which outputs the first analog signal S60a.

Figure 7:
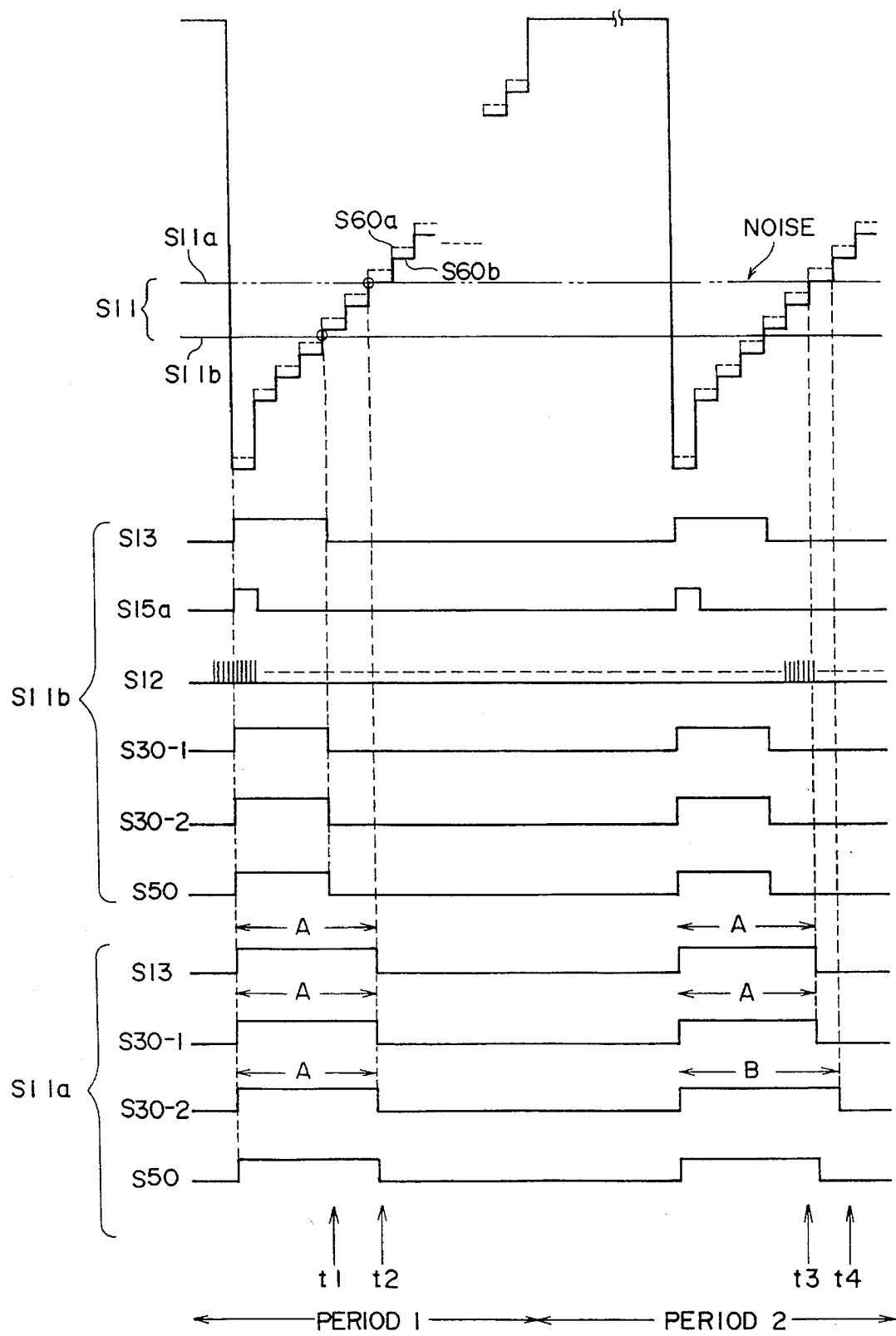
FIG. 7 is a timing diagram illustrating an operation of the voltage to pulse-width conversion circuit of the invention shown in FIG. 5.

FIG. 7 shows a timing diagram of the voltage to pulse-width conversion circuit 10 in FIG. 5. Referring to FIG. 7, the operation of the circuit of FIGS. 5 and 6 will be described below.

When the switch 21 for night lighting is turned on, a battery voltage V20 is applied to a variable resistor 22, an oscillator 25, and an inverter 26 as V21. When the battery voltage V21 is applied to the variable resistor 22, a voltage 0 to 13.8 V corresponding to a variable resistor value is applied to voltage divider type resistors 23 and 24. A voltage at a node of the voltage divider type resistors 23 and 24 is entered into an input terminal 11 of the voltage to pulse-width conversion circuit 10 as a PWM control signal S11 and sent to negative input terminals of the first and second comparators 17-1 and 17-2. When the battery voltage V21 is supplied to the oscillator 25, a clock signal S12 having a reference frequency is sent from said oscillator 25 to an input terminal 12 of the voltage to pulse-width conversion circuit 10, and then sent to a binary counter 14. When the clock signal S12 is sent to the binary counter 14, the binary counter 14 starts a counting operation and outputs a result of the counting to an input terminal I of the decoder 15. When the battery voltage V21 is applied to the inverter 26, said inverter 26 outputs an L-level signal to an OR gate 27. Accordingly, the OR gate 27 opens.

When the counting result of the binary counter 14 is sent to the input terminal I of the decoder 15, an H-level output signal S15a is output from a "0" output terminal Out 0 of said decoder 15 and the first RS-FF30-1 and the second RS-FF30-2 are set. When the first RS-FF30-1 and the second RS-FF30-2 are set, their output terminals Q are set to an H level. In response to this, an output signal S50 of the AND gate 50 is set to an H level. The D-FF19 fetches the H-level output signal S50 output from the AND gate 50 and outputs an H-level PWM signal S13 from the output terminal Q. The H-level PWM signal S13 is output from the OR gate 27.

If the PWM control signal S11 is assumed to be have a magnitude S11b in FIG. 7, both levels of the first analog signal S60a output from the D/A converter 60 and the second analog signal S60b exceed the level of the PWM control signal S11b at time t1. Accordingly, the first RS-FF30-1 and the second RS-FF30-2 are reset by H-level comparison result signals S17-1 and S17-2 output from the first and second comparators 17-1 and 17-2 at time t1. When the first RS-FF30-1 and the second RS-FF30-2 are reset, the RS-FF30-1 and RS-FF30-2 output L-level output signals S30-1 and S30-2, respectively. When the output signals S30-1 and S30-2 are set to an L-level, the AND gate 50 outputs an L-level output signal S50. The D-FF19 fetches this L-level output signal S50 and outputs an L-level PWM signal S13. The L-level PWM signal S13 is output from the OR gate 27.

The PWM control signal S11 is now assumed to be an S11a in FIG. 7. Then, it should be noted that there is just a little or almost no difference between the level of the second analog signal S60b output from the D/A converter 60 and the level of the S11b at time t2. The difference between them makes the level of the comparison result signal S17-2 output from the second comparator 17-2 unstable at time t2. Due to the second RS-FF30-2 which forcibly fixes the level of the output signal S30-2 to an L level at the first change of the level of the comparison result signal S17-2, however, a more stable PWM signal S13 can be output from the D-FF19. In addition, a comparison result signal S17-1 output from the first comparator 17-1 is relatively stable at time t2, therefore, the PWM signal S13 is further stablized.

In addition, it should be noted that the level of the PWM control signal S11*a* in a period 1 is not the same as for a period 2 due to noise on the PWM control signal S11*a*. The level of the first analog signal S60*a* exceeds the level of the PWM control signal S11*a* at time t3. Accordingly, the first RS-FF30-1 is reset by an H-level comparison result signal S17-1 output from the first comparator 17-1 at time t3. When the first RS-FF30-1 is reset, the RS-FF30-1 outputs an L-level output signal S-301. As apparent from FIG. 7, the period at an H level (hereinafter "pulse width") of the signal S30-1 output by the RS-FF30-1 is A in both periods 1 and 2.

On the other hand, the level of the second analog signal S60*b* does not exceed the level of the PWM control signal S11*a* at time t3. Accordingly, the second RS-FF30-2 outputs an H-level output signal S30-2 at time t3. At time t4, however, the level of the second analog signal S60*b* exceeds the level of the PWM control signal S11*a*. Therefore, the second RS-FF30-2 is reset by an H-level comparison result signal S17-2 output from the second comparator 17-2 at time t4. When the second RS-FF30-2 is reset, the RS-FF30-2 outputs an L-level output signal S-305 2. As apparent from FIG. 7, a period at an H level, a pulse width of the signal S30-2 output from the RS-FF30-2 is B in the period 2.

The brightness of a phosphor indicator tube is determined by the above-described pulse widths. Accordingly, a change of a pulse width at every period means that the brightness is not fixed, in other words, the display of the phosphor indicator tube is flickering. According to the present invention, however, there is provided an AND gate 50 which performs the AND operation for the signals S30-1 and S30-2, which results in a PWM signal S13 having a pulse width A in both periods 1 and 2. Therefore according to this invention, a PWM signal S13 having a fixed pulse width can be obtained even if noise is given to the PWM control signal S11. In other words, it provides a more precise and stable voltage to pulse-width conversion circuit.

This invention is not limited to the above embodiment, but is allowed to have various modifications such as, for example;

(i) The RS-FF30, the RS-FF30-1, and the RS-FF30-2 in FIGS. 1 and 5 can be replaced with other flip-flops such as a reset D-FF. If the RS-FF30 in FIG. 1 is replaced with a reset D-FF, for example, a data input terminal of said D-FF is fixed to an H level, a clock input terminal is connected to an output terminal of the comparator 17, and a reset input terminal is connected to a "0" output terminal Out 0 of the decoder 15.

(ii) The AND gate 50 in FIG. 5 can be replaced with another logical circuit such as a NAND gate or a NOR gate. If the NAND or NOR gate is used, for example, their input terminals are connected to reversal output terminals of the RS-FF30-1 and RS-FF30-2.

(iii) Although an 8-bit binary counter, an 8-bit decoder, and a 6-bit resistance voltage divider type D/A converter are used in FIGS. 1 and 5, those of a different number of bits can be used and the binary counter can be changed to another type of a counter. If so, the decoder should be associated with the count code of the counter to be used. The resistance voltage divider type D/A converter can be changed to a D/A converter having another structure which provides similar outputs of the digital to analog conversion.

(iv) In FIGS. 1 and 5, there can be various modifications, for example, that the input circuit connected to the input terminal 11 is changed to a circuit having another configuration. In addition, this invention can be applied to various units such as car audio devices like a tuner, a cassette deck, a compact disk, a car clock, and other information display units or brightness control circuits of other electronic indicating instruments.

What is claimed is:

1. A voltage to pulse-width conversion circuit comprising:

a clock input terminal for receiving a clock signal having a reference frequency;

a reference voltage input terminal for supplying a reference voltage;

an output node for applying a pulse-width signal;

a counter receiving the clock signal and producing a digital output signal having a multi-bit digital value corresponding to a count of cycles of the reference frequency;

a decoder for decoding the multi-bit digital value of the digital output signal and out putting first and second decoded signals;

a digital/analog converter for receiving the first and second decoded signals and producing an analog signal having an analog voltage corresponding to the first and second decoded signals;

a comparator for comparing the reference voltage and the analog voltage and producing a comparison result signal corresponding to the voltage difference between the reference voltage and the analog voltage; and a setting circuit for setting the level of the output node to a first logic level in response to the first decoded signal and to a second logic level in response to the comparison result signal after the first decoded signal, wherein said setting circuit comprises a reset-set flip flop having a reset terminal receiving the comparison result signal and a set terminal receiving the first decoded signal.

2. A voltage to pulse-width conversion circuit as set forth in claim 1, wherein the first decoded signal indicates a 0 value.

3. A voltage to pulse-width conversion circuit as set forth in claim 1, wherein said counter counts the reference frequency signal continuously.

4. A voltage to pulse-width conversion circuit comprising:

a clock input terminal for receiving a clock signal having a reference frequency;

a reference voltage input terminal for supplying a reference voltage;

an output node for applying a pulse-width signal;

a counter receiving the clock signal and producing a digital output signal having a multi-bit digital value corresponding to a count of cycles of the reference frequency;

a decoder for decoding the multi-bit digital value of the digital output signal and outputting first and second decoded signals, said first decoded signal indicating a 0 value;

a digital/analog converter for receiving the first and second decoded signals and producing an analog signal having an analog voltage corresponding to the first and second decoded signals;

a comparator for comparing the reference voltage and the analog voltage and producing a comparison result signal corresponding to the voltage difference between the reference voltage and the analog voltage; and a setting circuit for setting the level of the output node to a first logic level in response to the first decoded signal and to a second logic level in response to the comparison result signal after the first decoded signal.

5. A voltage to pulse-width conversion circuit as set forth in claim 4, wherein said setting circuit comprises a reset-set flip flop having a reset terminal receiving the comparison result signal and a set terminal receiving the first decoded signal.

6. A voltage to pulse-width conversion circuit as set forth in claim 3, wherein said counter counts the reference frequency signal continuously.

7. A voltage to pulse-width conversion circuit comprising:

a clock input terminal for receiving a clock signal having a reference frequency;

a reference voltage input terminal for supplying a reference voltage;

an output node for applying a pulse-width signal;

a counter receiving the clock signal and producing a digital output signal having a multi-bit digital value corresponding to a count of cycles of the reference frequency, said counter counting the reference signal continuously;

a decoder for decoding the multi-bit digital value of the digital output signal and outputting first and second decoded signals;

a digital/analog converter for receiving the first and second decoded signals and producing an analog signal having an analog voltage corresponding to the first and second decoded signals;

a comparator for comparing the reference voltage and the analog voltage and producing a comparison result signal corresponding to the voltage difference between the reference voltage and the analog voltage; and a setting circuit for setting the level of the output node to a first logic level in response to the first decoded signal and to a second logic level in response to the comparison result signal after the first decoded signal.

8. A voltage to pulse-width conversion circuit as set forth in claim 7, wherein said setting circuit comprises a reset-set flip flop having a reset terminal receiving the comparison result signal and a set terminal receiving the first decoded signal.

9. A voltage to pulse-width conversion circuit as set forth in claim 7, wherein the first decoded signal indicates a 0 value.

10. A voltage to pulse-width conversion circuit comprising:

a clock input terminal for receiving a clock signal having a reference frequency;

a reference voltage input terminal for supplying a reference voltage;

an output node for applying a pulse-width signal;

first and second node;

a counter receiving the clock signal and producing a digital output signal having a multi-bit digital value corresponding to a count of cycles of the reference frequency;

a decoder for decoding the multi-bit digital value of the digital output signal and outputting first and second decoded signals;

a digital/analog converter for receiving the first and second decoded signals and producing first and second analog signals each of which has first and second analog voltages corresponding to the first and second decoded signals;

a first comparator for comparing the reference voltage and the first analog voltage and producing a first comparison result signal corresponding to the voltage difference between the reference voltage and the first analog voltage;

a second comparator for comparing the reference voltage and the second analog voltage and producing a second comparison result signal corresponding to the voltage difference between the reference voltage and the second analog voltage;

a first setting circuit for setting the level of the first node to a first logic level in response to the first decoded signal and to a second logic level in response to the first comparison result signal after the first decoded signal;

a second setting circuit for setting the level of the second node to the first logic level in response to the second decoded signal and to the second logic level in response to the second comparison result signal after the second decoded signal; and a logic gate for setting the level of the output node to the first logic level in response to the first logic level of the first and second nodes.

11. A voltage to pulse-width conversion circuit as set forth in claim 10, wherein said first and second setting circuit comprise first and second reset-set flip flop having a reset terminal and a set terminal respectively, the set terminals of the first and second reset-set flip flop receive the first decoded signal and the reset terminals of the first and second reset-set flip flop receive the first and second comparison result signals respectively.

12. A voltage to pulse-width conversion circuit as set forth in claim 10, wherein the first decoded signal indicates 0 value.

13. A voltage to pulse-width conversion circuit as set forth in claim 10, wherein the value of the first analog voltage is different from the value of the second analog voltage.

14. A voltage to pulse-width conversion circuit as set forth claim 10, wherein the value of the first analog voltage is larger than the value of the second analog voltage.

* * * * *